(12) United States Patent
Nightingale

(10) Patent No.: US 6,218,826 B1
(45) Date of Patent: Apr. 17, 2001

(54) MEASUREMENT PROBE HAVING AN INTERNAL ALIGNMENT FIXTURE

(75) Inventor: Mark W. Nightingale, Washougal, WA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/300,503

(22) Filed: Apr. 28, 1999

(51) Int. Cl.$^7$ .................................................. G01R 1/06
(52) U.S. Cl. ................................................... 324/149
(58) Field of Search ............................. 324/149, 72.5, 324/754, 555, 690, 724; 439/482

(56) References Cited

U.S. PATENT DOCUMENTS 5,898,299 * 4/1999 Fodali .................................. 324/149

* cited by examiner

Primary Examiner—Safet Metjahic
Assistant Examiner—J Kerveros
(74) Attorney, Agent, or Firm—William K. Bucher

(57) ABSTRACT

A measurement probe includes a sacrificial assembly fixture as part of the probe head. The probe head has probing contact at one end thereof and a transmission cable extending from the other end thereof and includes a housing having interior surfaces with the probing contact disposed in one end of the housing and the transmission cable extending from the other end. A substrate is disposed within the housing and is electrically connected to the probing contact and the transmission cable. An alignment fixture has a base with deformable ribs formed on one surface thereof and opposing sidewalls extending from the base opposite the surface with the deformable ribs. Each sidewall has an interior surface with a channel formed therein at the exposed ends of the sidewalls for engaging the substrate. The deformable ribs are disposed against a first interior surface of the housing for positioning the substrate adjacent to an opposing second interior surface of the housing and the sidewalls align the substrate between opposing interior surface opposite the first and second interior surfaces.

3 Claims, 3 Drawing Sheets

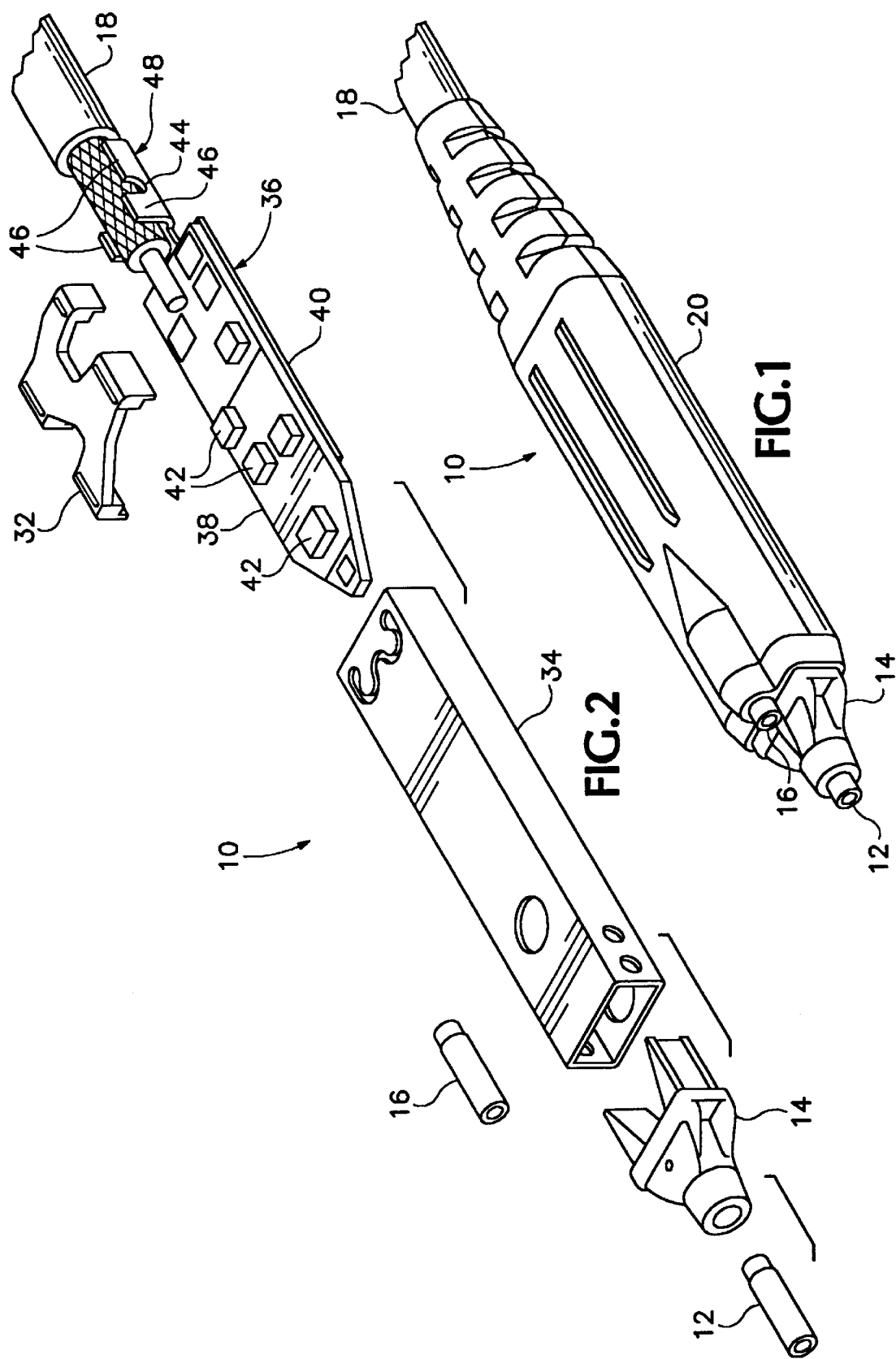

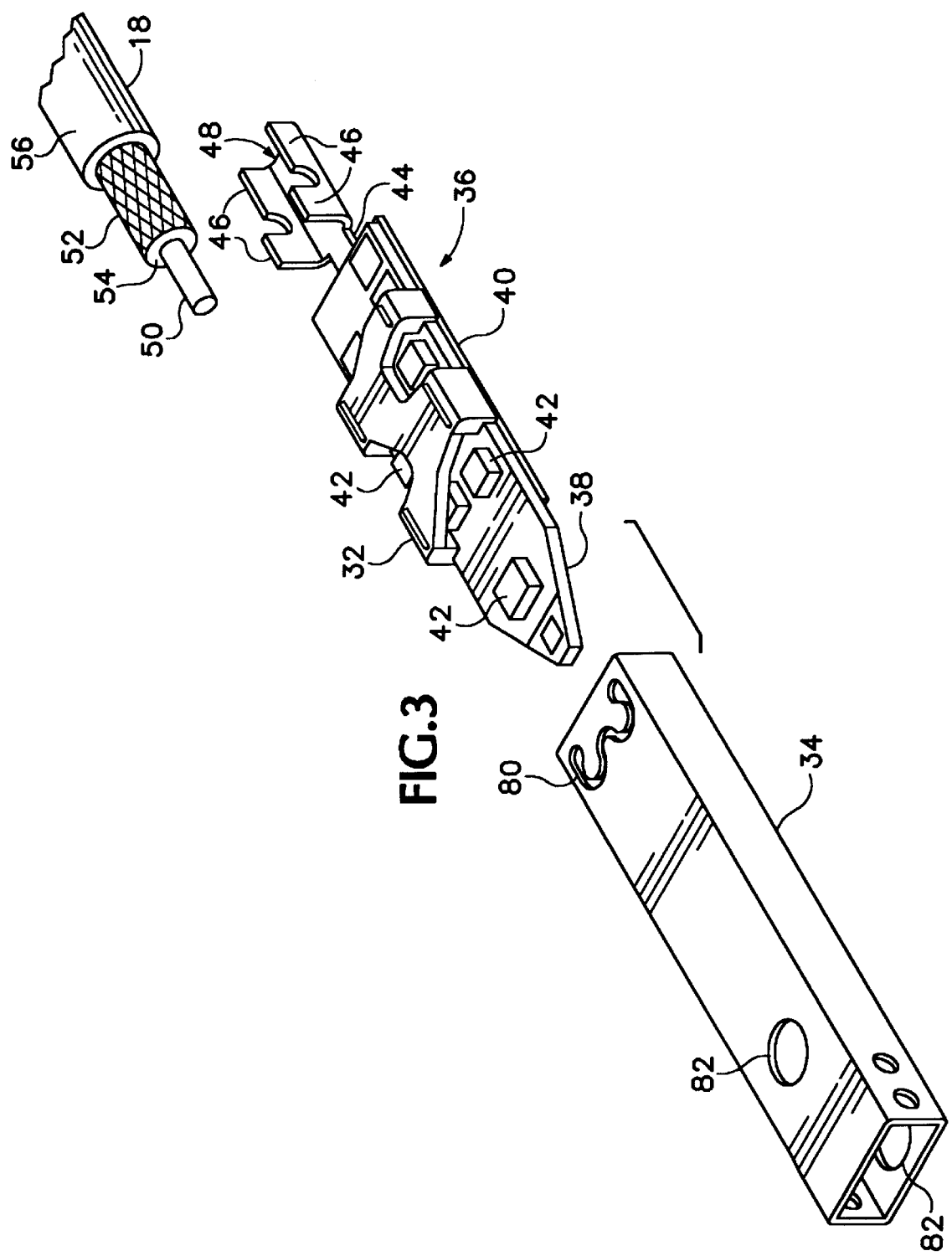

MEASUREMENT PROBE HAVING AN INTERNAL ALIGNMENT FIXTURE

BACKGROUND OF THE INVENTION

The present invention related generally to measurement test probes and more particularly to a measurement probe having an internal alignment fixture.

Measurement instrument probes generally consist of a probing head having an electrically conductive tube with an insulated and coaxially disposed probing tip extending from one end and a transmission cable, such as coaxial cable, extending from the other end. Disposed within the electrically conductive tube is a substrate having electrical components mounted thereon for compensating the probe head and/or terminating the head in the characteristic impedance of the transmission cable. The electrically conductive tube and a portion of the transmission cable extending from the tube is surrounded by insulating material. The other end of the transmission cable is connected to a compensation box having electrical circuitry therein that compensates for aberrations in an acquires signal and a connector for connecting the measurement probe to a test instrument, such as an oscilloscope or the like.

Two type of electrical measurement probes using the above design are passive voltage probes and active FET probes. Passive voltage probes generally have a large value series resistor, shunted by a capacitor, in the probing head coupled via the transmission cable to the series connected resistor and shunting capacitor in the measurement instrument. The voltage divider network developed by the series connected resistors presents a high impedance to a circuit under test at low frequencies, such as 5 MHZ or lower. As the frequency of the test signal increases the impedance level of the passive probe decreases. Active FET probes includes active components, such as field effect transistors or other active devices, that results in higher input impedance without the loss of the signal, i.e. low input capacitance that is typically less than 0.4 pF to 2 pF and high input resistance values that are typically greater than 100 K ohms. Active probes also have greater bandwidth and linear dynamic range than passive probes as well as driving the transmission cable at its characteristic impedance of 50 ohms.

As probe head size decreases and the bandwidth requirement increase into the multi-gigahertz range, the accurate positioning of the probe head components become critical. Traditionally, assembly fixtures are used to hold the various elements of the probing head in position as the head is assembled. This includes holding and accurately positioning the substrate in the electrically conductive tube for soldering, glueing or the like. However, because of the decreased size of the probing head and its associated components, traditional assembly fixtures cannot be used for holding and securing the substrate in the electrically conductive tube.

What is needed is an assembly fixture that holds and accurately positions a substrate in an electrically conductive tube of a probing head of a electrical measurement instrument. The fixture should be electrically neutral so an not to add electrical aberration to the electrical characteristics of the probing head. The fixture should also be small enough to be incorporated as part of the probing head.

SUMMARY OF THE INVENTION

Accordingly, the present invention is to a probe head for a measurement probe having a sacrificial assembly fixture as part of the probe head. The probe head has probing contact at one end thereof and a transmission cable extending from the other end thereof and includes a housing having interior surfaces with the probing contact disposed in one end of the housing and the transmission cable extending from the other end. A substrate is disposed within the housing and is electrically connected to the probing contact and the transmission cable. An alignment fixture has a base with deformable ribs formed on one surface thereof and opposing sidewalls extending from the base opposite the surface with the deformable ribs. Each sidewall has an interior surface with a channel formed therein at the exposed ends of the sidewalls for engaging the substrate. The substrate and the alignment fixture are inserted into the housing with the deformable ribs disposed against a first interior surface of the housing for positioning the substrate adjacent to an opposing second interior surface of the housing and the sidewalls align the substrate between opposing interior surface opposite the first and second interior surfaces. The base and sidewalls of the alignment fixture may have cutouts formed therein for exposing components on the substrate. The probe head may also have a carrier on which the substrate and the transmission cable is secured with the alignment fixture positioning the carrier against an opposing second interior surface of the housing.

The objects, advantages and novel features of the present invention are apparent from the following detailed description when read in conjunction with appended claims and attached drawings.

BRIEF DESCRIPTION OF THE DRAWINGS

FIG. 1 is a perspective view of a probing head incorporating the sacrificial alignment fixture in a measurement probe according to the present invention.

FIG. 2 is an exploded perspective view of the probing head incorporating the sacrificial alignment fixture in the measurement probe according to the present invention.

FIG. 3 is an exploded perspective view of the probing head components including the sacrificial alignment fixture in the measurement probe according tot he present invention.

DESCRIPTION OF THE PREFERRED EMBODIMENT

Figure 4A:
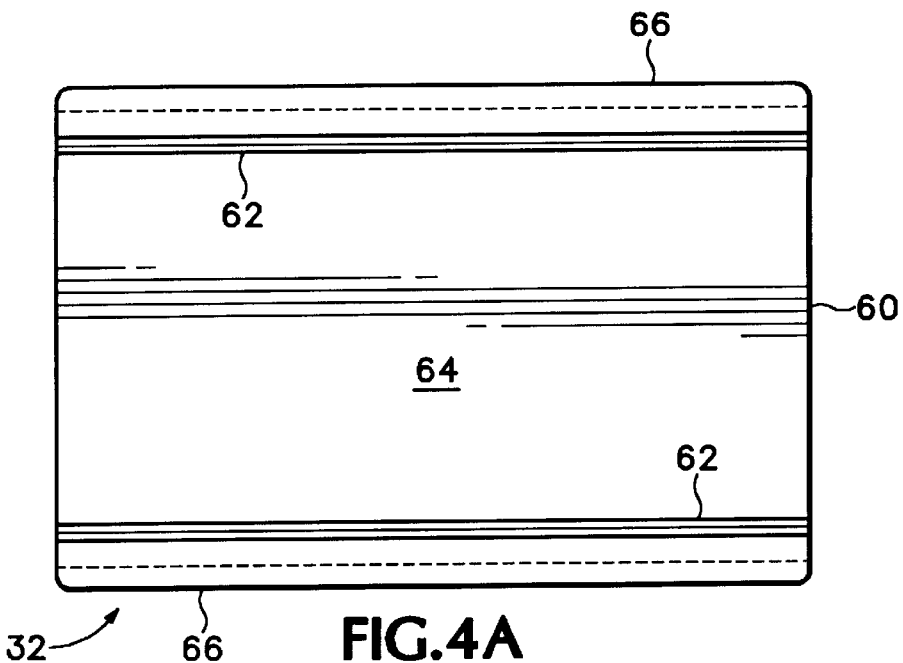
FIGS. 4A and 4B are respective top plan and side end views illustrating a representative sacrificial alignment fixture in the probing head of the measurement probe according to the present invention.

Referring to FIG. 1, there is shown a perspective view illustrating a probe head 10 of a measurement probe incorporating the internal alignment fixture according to the present invention. The probe head 10 includes a probing tip 12 mounted in an insulating plug 14 that is disposed in one end of the probe head 10. A ground probing tip 16 is mounted on the probe head 10 adjacent to and in close proximity to the probing tip 12. Extending from the opposite end of the probe head 10 is a transmission cable 18. Insulating material 20 surrounds the probe head 10 including a substantial portion of the ground probe tip 16 and a portion of the transmission cable 18. The insulating material 20 electrically isolates the conductive elements of the probe head 10 and provides strain relief for the transmission cable 18 at the probe head 10 cable 18 interface. In the preferred embodiment of the invention, the insulating material is an injected molded part that is placed around the probe head 10, ground probe tip 16 and the end of the transmission cable 18.

Referring to FIG. 2, there is shown an exploded perspective view of the probe head 10 with an internal alignment fixture 32 incorporated into the probe head. Like elements of FIG. 2 are the same as in FIG. 1. The probe head 10 has an elongate electrically conductive housing 34 and a carrier 36. Disposed within one end of the housing 34 is the plug 14 of insulating material having the probing tip 12 extending there through. One end of the probing tip 12 accepts a variety of probing adapters (not shown) for electrically connecting the probing tip 12 to a device under test. The other end of the probing tip 12, which is exposed within the housing 34, is electrically connected to a substrate 38 secured to one of two flat portions 40 of the carrier 36. In the preferred embodiment of the present invention, the substrate 38 is secured to the carrier by soldering and glueing using an epoxy adhesive. Mounted on the substrate 38 are electrical components 42, such as passive components, e.g. resistors, capacitors, and the like, and/or active components, such as integrated circuit and/or transistor, for compensating the probe and/or terminating the electrical signal output of the substrate 38 in the characteristic impedance of the transmission cable 18. Another flat portion 44 of the carrier 36 extends from the first flat portion 40 and has tabs 46 extending from either side of the flat portion 44. The second flat portion 44 and the tab portions 46 form a channel-like structure 48 for accepting the transmission cable 18.

Referring to FIG. 3, the transmission cable 18, in the form of a coaxial cable, has a center conductor 50 surrounded by a shielding conductor 52 with insulating material 54 separating the center conductor 50 from the shielding conductor 52. Surrounding the shielding conductor 52 is an outer insulating sheath 56. Generally, the shielding conductor 52 in a coaxial cable 18 is made of many strands of fine wire braided together in one or more layers. The transmission cable 18 is prepared for the carrier 36 by removing a portion of the outer insulating layer 56 from one end of the cable 18 to expose the shielding conductor 52. A portion of the shielding conductor 52 and the insulating material 54 is removed from the end of the cable to expose the center conductor 50. The prepared end of the cable 12 is positioned on the carrier 36 with the exposed shielding conductor 52 disposed in the channel-like structure 48 formed by the second flat portion 44 and the tabs 46. The center conductor 50 is positioned on the substrate 38 and electrically connected to the electrical circuitry thereon. The shielding conductor 52 is secured to the carrier 36 by soldering or other appropriate securing means that does not alter the characteristic impedance of the transmission cable 18. Another type of securing means is gluing the transmission cable 18 to the carrier 36 using an adhesive, such as epoxy or the like. The center conductor 50 is soldered to the substrate 38. The internal alignment fixture 32 is positioned on the prepared assembly, consisting of the carrier 44, substrate 50 and transmission cable 12, and inserted into the housing 34.

Figure 4B:
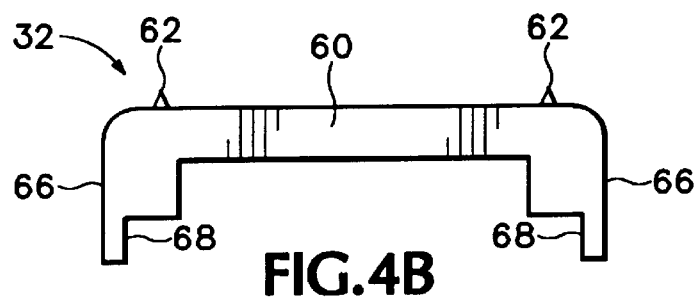
Figure 5:
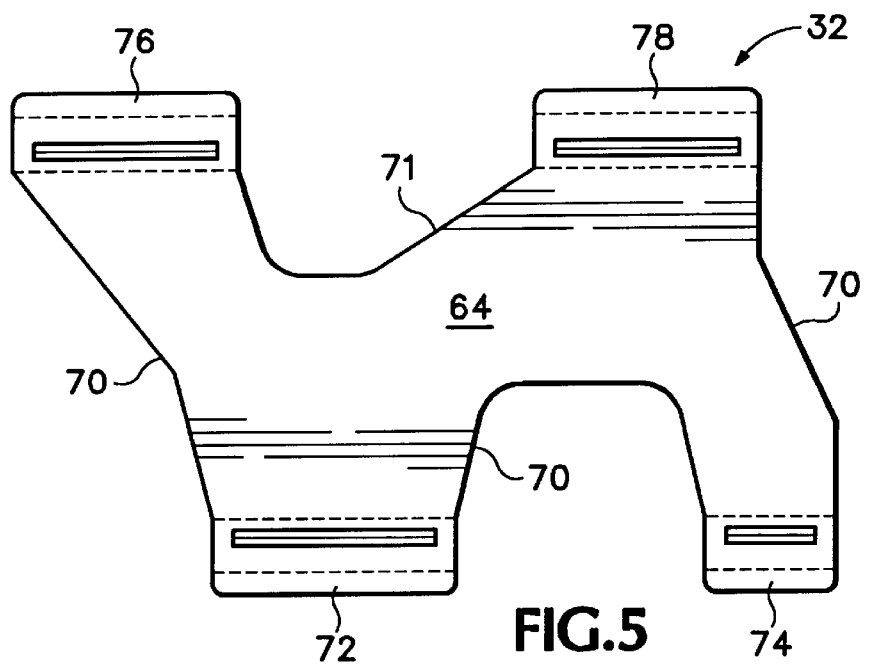
FIG. 5 is a top plan view illustrating the sacrificial alignment fixture used in the probing head of the measurement probe according to the present invention.

FIGS. 4A and 4B respectively show a top plan view and a side end view of a representative internal alignment fixture 32. The alignment fixture 32 has a base 60 with deformable ribs 62 formed on the exterior surface 64 of the base 60 as represented in FIG. 4A as the two sets of closely spaced parallel lines on either side of the base 60. Extending downward from the two opposite sides of the base are opposing sidewalls 66. The exposed ends of the sidewalls 66 are notched to form channels 68 that receive the substrate 38 there between. FIG. 5 shows a top plan view of the alignment fixture 32 with openings 70 and 71 formed in the base 60 and sidewalls 66 allowing for the exposure of portions of the substrate underneath. The resulting fixture 32 has segmented sidewalls 72, 74, 76, 78 of varying width on each side of the base. The shape and position of the openings in the fixture 32 are a function of component placement on the substrate 38 and any requirements for having access to a particular location on the substrate 38.

Referring again to FIG. 3, the prepared assembly with the alignment fixture 32 mounted thereon is inserted into the housing 34 so that the tabs 46 extend past tab 80 formed in the housing 34. Apertures 82 formed in the housing 34 allow access to the substrate 38 for securing the substrate within the housing 34 and for affixing other components to the substrate. For example, the large aperture on the top of the housing 34 may be used for soldering the probing tip 12 to the substrate 38. Further, the second probing tip 16 may be connected to housing 34 or a ground contact on the substrate 38 for providing a grounded probing tip on the probe head 10. Preferably, the substrate 38 secured to the housing 34 by soldering glueing using adhesives, such as epoxy or the like, to provide and electrical connection between the substrate 38 and the housing 34. The tab 80 is bent from a first formed positioned to a second position within the housing 34 for engaging the tabs 46 on the carrier 36. The tabs 58 and 62 are positioned in engaging contact to provide strain relief and pull strength for the probe head 10/transmission cable 18 connection.

In the preferred embodiment of the invention, the housing 34 for the probe head 10 is an elongate rectangular shaped tubular body formed of brass coated with sulfimate-nickel having a thickness in the range of 100 to 200 micro inches. The sides of the tubular body are nominally 0.125 inches and 0.250 inches with a length in the range of 1.195 inches. The walls of the tubular body have a nominal thickness of 0.014 inches. The tab 80 on the housing 34 is nominally positioned 1.055 inches from the front edge of the housing with the front edge as being defined as the end of the housing accepting the probing tip plug 14. The tab 80 is formed in the housing 34 using well known machining processes that produce a tab having a nominal width from side to side of 0.128 inches and a length of 0.066 inches. The corners of the machined tab 80 are radiused for strain relief and the center portion of the tab 80 has an indentation formed therein having a nominal radius of 43 inches forming mirrored tips on the tab 80.

The carrier 36 is formed from brass having a nominal thickness of 0.013 inches and plated with gold having a nominal thickness from 3 to 8 micro inches over an electroless nickel having a nominal thickness of 0.00005 inches. The carrier 36 has an over all length in the range of 0.970 inches and a width of 0.170 inches. The flat portion 40 receiving the substrate 38 has a nominal length of 0.710 inches and a width of 0.170 inches. The channel-like structure 48 that receives the transmission cable 18 may be integrally formed with the flat portion 40 as is done in the preferred embodiment. The flat portion 44 of the channel-like structure 48 has a nominal width of 0.055 inches and an overall length of 0.260 inches. The tabs 46 are formed on opposite sides of the flat portion 44 with one set of opposing tabs 46 starting at a nominal 0.040 inches from the junction of the flat portions 40 and 44 and having a nominal height of 0.089 inches from the bottom of the carrier 38. A second set of opposing tabs 46 have a nominal height of 0.063 inches from the bottom of the carrier 38. The two sets of tabs are separated from each other by a radiused opening having a radius of 0.025 inches.

The alignment fixture 32 is an injected molded part make of a polyamide plastic, such as Ultem 1000, manufactured and sold by General Electric Plastics. In the preferred embodiment, the overall length of the fixture 32 is in the range of 0.370 inches with a width in the range of 0.219 inches. The overall height of the fixture 32 is in the range of 0.068 inches with the height of the channels 68 being in the range of 0.020 inches. The interior width of the fixture 32 between the channel 68 walls is in the range of 0.203 inches. The thickness of the sidewalls is in the range of 0.030 inches. The deformable ribs are nominally 0.005 inches high and are positioned approximately 0.027 inches from the outer sidewall surfaces. In FIG. 5, the offset between the segmented sidewalls 72 and 76 is nominally 0.090 inches with the length of segmented sidewall 72 being a nominal 0.110 inches and the length of segmented sidewall 76 being 0.100 inches. The opening 70 between segmented sidewalls 72 and 74 has a nominal length of 0.060 inches with a nominal depth of 0.090 inches measured from the outside of the sidewalls 72 and 74. The opening 71 between segmented sidewalls 76 and 78 has a nominal length of 0.130 inches with a nominal depth of 0.080 inches measured from the outside of the sidewalls 76 and 78. The offset between segmented sidewall 78 and segmented sidewall 74 is a nominal 0.035 inches.

A probe head has been described for a measurement probe having a sacrificial alignment fixture as part of the probe head. The probe head includes a housing having interior surfaces with a probing contact disposed in one end of the housing and the transmission cable extending from the other end. A substrate is disposed within the housing and is electrically connected to the probing contact and the transmission cable. A sacrificial alignment fixture is positioned on the substrate. The fixture has a base with deformable ribs formed on one surface thereof and opposing sidewalls extending from the base opposite the surface with the deformable ribs. Each sidewall has an interior surface with a channel formed therein at the exposed ends of the sidewalls for engaging the substrate. The substrate and fixture are inserted into the housing with the deformable ribs being disposed against a first interior surface of the housing for positioning the substrate adjacent to an opposing second interior surface of the housing and the sidewalls align the substrate between opposing interior surface opposite the first and second interior surfaces. The base and sidewalls of the alignment fixture may have cutouts formed therein for exposing components on the substrate. The probe head may also have a carrier on which the substrate and the transmission cable is secured with the alignment fixture positioning the carrier against an opposing second interior surface of the housing.

It will be obvious to those having skill in the art that many changes may be made to the details of the above-described embodiments of this invention without departing from the underlying principles thereof The scope of the present invention should, therefore, be determined only by the following claims.

What is claimed is:

1. A measurement probe having a probe head with a probing contact at one end thereof and a transmission cable extending from the other end thereof comprising:

a housing having interior surfaces with the probing contact disposed in one end of the housing and the transmission cable extending from the other end;

a substrate having opposing first and second surfaces disposed within the housing and electrically connected to the probing contact and the transmission cable; and an alignment fixture having a base with deformable ribs formed on one surface thereof and opposing sidewalls extending from the base opposite the surface with the deformable ribs, with each sidewall having an interior surface with a channel formed therein at the exposed ends of the sidewalls for engaging the first surface of the substrate, the deformable ribs being disposed against a first interior surface of the housing for positioning the second surface of the substrate adjacent to an opposing second interior surface of the housing and the sidewalls aligning the substrate between opposing interior surface opposite the first and second interior surfaces.

2. The measurement probe as recited in claim 1 wherein the base and sidewalls of the alignment fixture has cutouts formed therein for exposing components on the substrate.

3. The measurement probe as recited in claim 1 further comprising a carrier having first and second flat portions with the substrate mounted on the first flat portion and the transmission cable positioned on the second flat portion and the alignment fixture positioning the carrier against an opposing second interior surface of the housing.

* * * * *